US009932673B2

(12) United States Patent
Jordan et al.

(10) Patent No.: US 9,932,673 B2
(45) Date of Patent: Apr. 3, 2018

(54) MICROWAVE PLASMA APPARATUS AND METHOD FOR MATERIALS PROCESSING

(71) Applicant: Amastan Technologies LLC, Storrs, CT (US)

(72) Inventors: Eric Jordan, Storrs, CT (US); Baki Cetegen, Glastonbury, CT (US); Kamal Hadidi, Somerville, MA (US); Paul P. Woskov, Bedford, MA (US)

(73) Assignee: AMASTAN TECHNOLOGIES LLC, North Andover, MA (US)

( * ) Notice: Subject to any disclaimer, the term of this patent is extended or adjusted under 35 U.S.C. 154(b) by 353 days.

(21) Appl. No.: 14/298,215

(22) Filed: Jun. 6, 2014

(65) Prior Publication Data

US 2014/0287162 A1  Sep. 25, 2014

Related U.S. Application Data

(62) Division of application No. 12/015,842, filed on Jan. 17, 2008, now Pat. No. 8,748,785.

(60) Provisional application No. 60/881,357, filed on Jan. 18, 2007.

(51) Int. Cl.

| | | |
|---|---|---|
| *H05B 6/70* | (2006.01) | |
| *B23K 10/00* | (2006.01) | |
| *C23C 16/513* | (2006.01) | |
| *C23C 16/511* | (2006.01) | |
| *H05H 1/30* | (2006.01) | |
| *C23C 4/134* | (2016.01) | |

(52) U.S. Cl.
CPC ............ *C23C 16/511* (2013.01); *C23C 4/134* (2016.01); *C23C 16/513* (2013.01); *H05H 1/30* (2013.01)

(58) Field of Classification Search
CPC ........ H05H 1/30; C23C 4/134; C23C 16/513; C23C 16/511
USPC .............. 219/690, 693, 695, 121.26, 121.48, 219/121.49, 121.43, 121.51, 121.59, 219/121.36, 212.41; 117/102, 103, 929; 75/364, 367, 336; 204/164, 298, 298.38; 118/723 ME, 723 MW, 723 IR; 427/757, 427/571, 575, 446; 264/10, 12
See application file for complete search history.

(56) References Cited

U.S. PATENT DOCUMENTS

| | | | | |
|---|---|---|---|---|
| 3,818,175 A | * | 6/1974 | Essers ................... | B23K 9/123 219/121.45 |
| 5,671,045 A | * | 9/1997 | Woskov ................. | G01N 21/73 333/99 PL |
| 5,707,419 A | * | 1/1998 | Tsantrizos .............. | B01J 19/088 264/10 |

(Continued)

*Primary Examiner* — Quang Van
(74) *Attorney, Agent, or Firm* — Womble Bond Dickinson (US) LLP; Deborah M. Vernon; Heath T. Misley (57) ABSTRACT

A microwave plasma apparatus for processing a material includes a plasma chamber, a microwave radiation source, and a waveguide guiding microwave radiation from the microwave radiation source to the plasma chamber. A process gas flows through the plasma chamber and the microwave radiation couples to the process gas to produce a plasma jet. A process material is introduced to the plasma chamber, becomes entrained in the plasma jet, and is thereby transformed to a stream of product material droplets or particles. The product material droplets or particles are substantially more uniform in size, velocity, temperature, and melt state than are droplets or particles produced by prior devices.

17 Claims, 4 Drawing Sheets

(56) References Cited

U.S. PATENT DOCUMENTS 5,825,485 A * 10/1998 Cohn ................... G01N 21/68
                                                    333/99 PL
6,362,449 B1 * 3/2002 Hadidi ................... H05H 1/30
                                                    219/121.36

* cited by examiner

MICROWAVE PLASMA APPARATUS AND METHOD FOR MATERIALS PROCESSING

CROSS-REFERENCE TO RELATED APPLICATIONS

This application is a divisional application of U.S. patent application Ser. No. 12/015,842, filed on Jan. 17, 2008 and issued as U.S. Pat. No. 8,748,785, which claims the benefit of U.S. Provisional Patent Application No. 60/881,357 filed Jan. 18, 2007, the entire contents of which are incorporated herein by reference.

FIELD OF THE INVENTION

The present invention relates to apparatuses and methods for plasma material processing and, more particularly, to apparatuses and methods for microwave plasma material processing.

BACKGROUND OF THE INVENTION

Thermal spray deposition of surface coatings has been used to form hard coatings on machine tools, thermal barriers on refractory surfaces, and hydrophobic layers on medical tools, paper mill rollers, or pharmaceutical equipment. In thermal spray deposition, molten droplets of a coating material impinge upon and adhere to a target surface. Ideal deposition conditions include substantial uniformity of droplet composition, size, velocity, and temperature. Such ideal deposition conditions cannot be achieved with current spray technologies. In particular, uniform droplet temperature has proven very difficult to achieve.

In the production of ceramic structures for gas turbines or for optical applications, crystalline ceramic powders are subjected to hot isostatic pressing to eliminate voids and porosity, thereby enhancing structural properties. However, semi-pyrolized or un-melted inclusions due to varying particle sizes can lead to inhomogeneities including voids that harm the properties of the end point ceramic body. Ceramics being generally brittle have mechanical properties strongly affected by flaws. It is also important to have highly uniform powders for optical applications, which are rapidly degraded by even a small percentage of defective regions. Rosenflanz et al., Bulk glasses and ultrahard nanoceramics based on alumina and rare-earth oxides, Nature, 430, 761-764 (12 Aug. 2004), proposed a method for making fine grained ceramics that involves making an amorphous glass phase by aggregation of molten particles in a coolant, deforming the glass to eliminate pores, and then crystallizing the glass. The resulting crystalline ceramic should have very fine grains. However, final mechanical and optical properties are highly dependent on the uniformity of the molten particles aggregated in the coolant.

Traditionally, molten droplets either for surface coating or for powder production have been formed by injecting particles of a source material between about ten microns (10 μm) and about one hundred microns (100 μm) diameter to a plasma jet. In most known thermal spray devices, the plasma jet is generated by a DC electric arc housed in an plasma torch, and the particles have been injected to the plasma jet external to the torch. Particles injected to the plasma jet external to the plasma torch necessarily enter the plasma jet off-axis, thereby introducing local non-uniformity to the entrainment of the particles in the plasma jet. The local non-uniformity of entrainment is exacerbated by highly chaotic behavior of the plasma jet, which can fluctuate in velocity by a factor of approximately two (2) at frequencies on the order of several thousand fluctuations per second (kHz). Moreover, entrainment of ambient gas into the plasma jet at the plasma torch exit results in a highly non-uniform radial and axial temperature profile external to the plasma torch. Accordingly, particles injected to the plasma jet external to the plasma torch are not uniformly entrained in or heated by the plasma jet. Thus, inhomogeneous particles are produced.

In order to improve the uniformity of product particles, efforts have been made to create axial feed arc-plasma torches. In particular, both Mettech, Inc. of Vancouver, Canada and Sulzer Metco of Switzerland have invested years of engineering effort toward developing reliable and commercially practicable axial feed arc-plasma torches. It is noted that internal structures required for axial injection are difficult to make compatible with internal structural constraints related to establishing and maintaining a DC arc plasma jet. DC electric arc plasma generation is a highly unstable process that can be disrupted by structural protrusions or foreign particles. Moreover, the high temperatures of the electric arc plasma impose strict limits on the design of injectors. Accordingly, known DC arc plasma torches are designed to have substantially smooth interior surfaces. Additionally, DC arc plasma torches require substantially particle-free interior volumes in the region where the arc is produced.

High-speed oxy-fuel flame jets also have been used to melt the powder that is sprayed onto the surface of interest. Although combustion torches often provide axial injection, such torches do not produce high enough temperatures to melt ceramic materials useful for thermal barrier coatings. Combustion torches also have high operational costs, and can produce coatings of notably varying chemical composition, because such torches require large quantities of substantially chemically pure fuel gases.

In either arc plasma or combustion torches, relatively high velocity of the plasma jet is required to adequately entrain and transport transversely injected particles. Accordingly, regardless of injection location, the majority of particle heating typically takes place exterior of the torch, where very non-uniform conditions prevail. When the non-uniformly heated particles impact on the surface to be coated, the particles cool, shrink, and adhere at varying rates to varying final thicknesses and bond strengths. More importantly, unmelted particles may be deposited which do not flatten leading to non-uniform structure. In the case of solution plasma spray, partially pyrolized or partially evaporated material can be deposited and subsequently shrink creating voids. All of the preceding non-uniformities of particles will lead to inhomogenous microstructures of the coating. Thus, arc plasma or combustion torches inherently provide a significant degree of non-uniform coating properties.

A third class of apparatus, highly amenable to axial injection, is the RF plasma gun developed by Boulos et al. RF plasma is formed by an induction coil producing a relatively low temperature, low velocity plasma. However, as taught by Boulos' 1985 article "The inductively coupled R.F. (Radio Frequency) Plasma," Pure Appl. Chem. 57, p. 1321, these torches are useful only for making powders or metal coatings from relatively large feedstock.

Therefore, there is a need in the industry for improved apparatuses and methods for generating substantially uniform particles by plasma material processing.

BRIEF SUMMARY OF THE INVENTION

According to the present invention, a microwave plasma apparatus for processing a material includes a plasma chamber, a microwave radiation source, and a waveguide guiding microwave radiation from the microwave radiation source to the plasma chamber. A process gas flows through the plasma chamber and the microwave radiation couples to the process gas to produce a plasma jet. A process material is introduced to the plasma chamber, becomes entrained in the plasma jet, and is thereby transformed to a stream of product material droplets or particles.

The microwave plasma apparatus is designed to enhance coupling of the microwave radiation to the process gas and to minimize leakage of the microwave radiation from the apparatus.

The plasma jet is stabilized within the plasma chamber either by viscous contact with a swirling flow of a shrouding gas, or by adhesion to an emitter rod, or by both methods. Stabilizing the plasma jet prevents it from contacting the plasma chamber and thereby enables use of conventional refractory materials to contain the extremely high temperatures of the plasma.

The extremely high temperatures of the plasma enable substantially more uniform and complete heating of the process material than has been attainable by prior devices.

Accordingly, the microwave plasma apparatus of the present invention provides product material droplets or particles that are substantially more uniform in size, velocity, temperature, and melt state than are droplets or particles produced by prior devices.

These and other objects, features and advantages of the present invention will become apparent in light of the detailed description of the best mode embodiment thereof, as illustrated in the accompanying drawings.

DETAILED DESCRIPTION OF PREFERRED EMBODIMENTS

Figure 1:
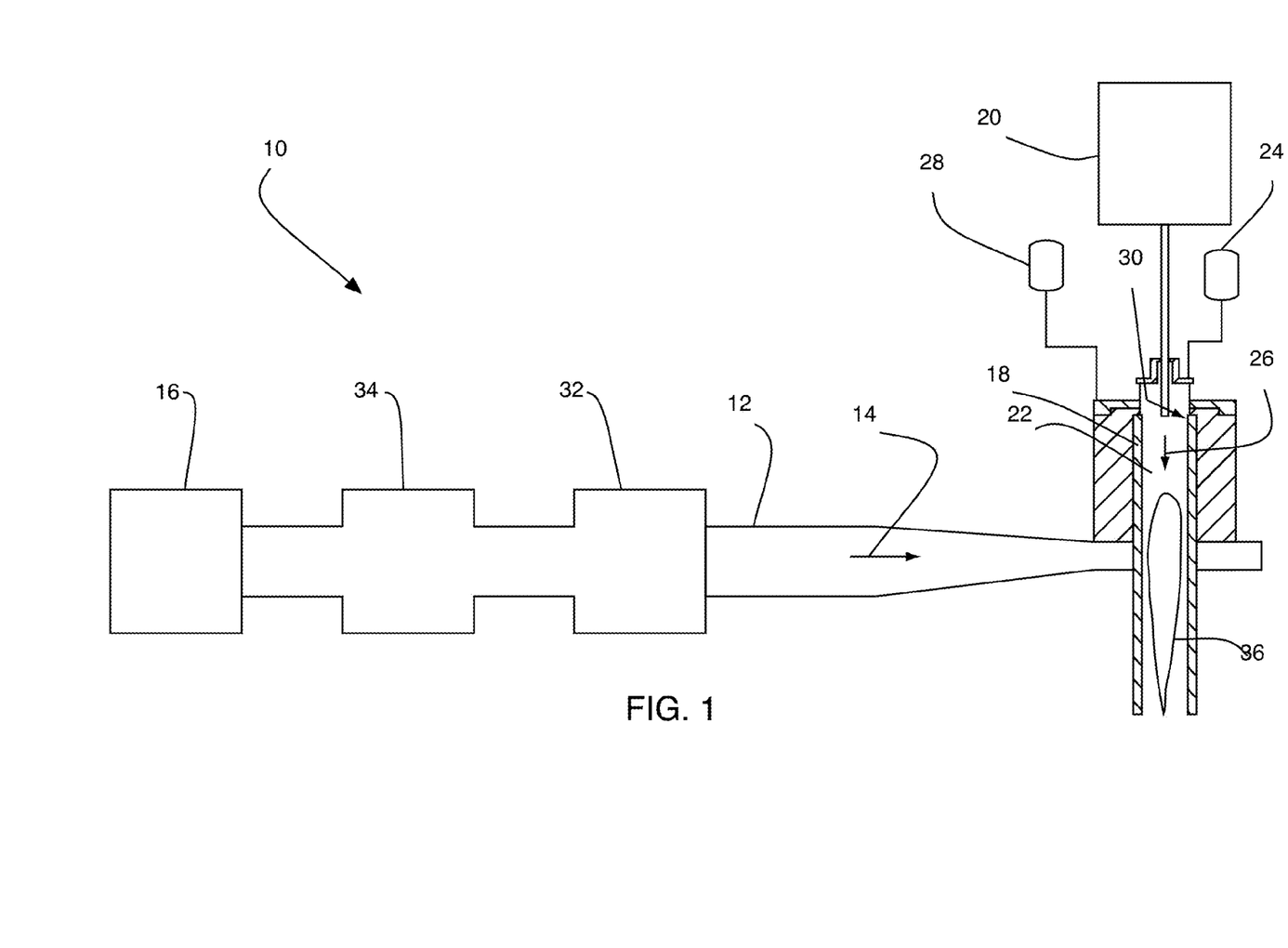
FIG. 1 is a system drawing of a microwave plasma apparatus for material processing, according to the present invention.

Referring to FIG. 1, a microwave plasma apparatus 10 for material processing, in accordance with an embodiment of the present invention, includes a waveguide 12 that guides microwave radiation 14 from a microwave source 16 to a plasma chamber 18 that penetrates the waveguide 12. The apparatus 10 also includes a material feeding system 20 that feeds a process material 22 to the plasma chamber 18, a pressurized source 24 that supplies a process gas 26 to the plasma chamber 18, and a pressurized source 28 that supplies a shrouding gas 30 to the plasma chamber 18. The apparatus 10 further includes an impedance matching unit 32 that communicates with the microwave source 16 and the waveguide 12 to minimize reflection of the microwave radiation 14 from the plasma chamber 18 to the microwave source 16. The apparatus 10 can also include a reflected power protector 34 in communication with the waveguide 12. The reflected power protector 34 could be a waveguide circulator that deflects reflected portions of the microwave radiation 14 to a dump receiver (not shown). The reflected power protector 34 alternatively could be a waveguide isolator. The apparatus 10 produces a plasma jet 36 within the plasma chamber 18.

Figure 2:
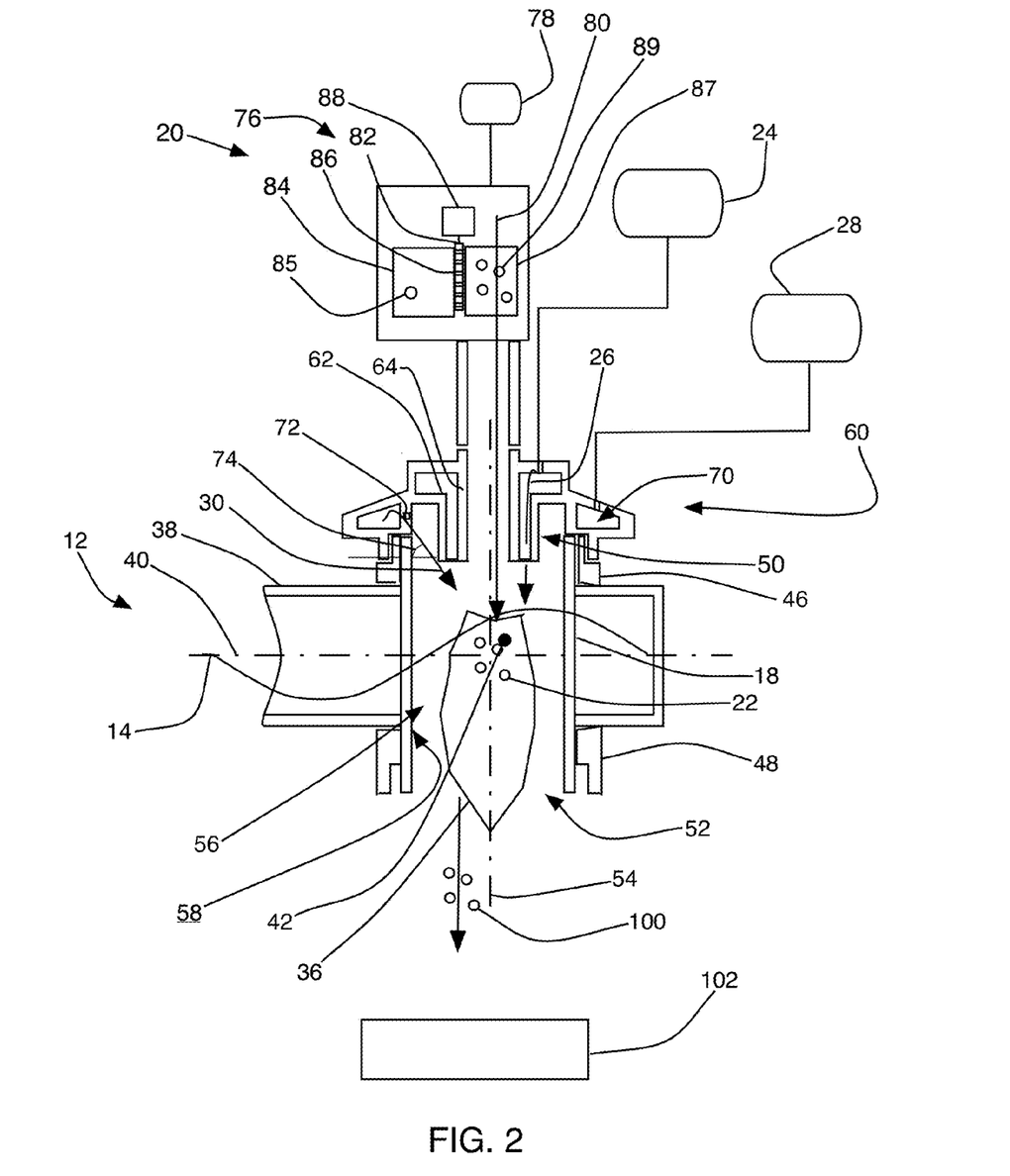
FIG. 2 is a schematic of a plasma chamber mounted to a piezo-electric multi-orifice droplet maker of the apparatus of FIG. 1, according to one embodiment.

Referring to FIG. 2, the waveguide 12 is a closed structure having a shell 38 defining a longitudinal axis 40. The shell 38 is designed substantially as discussed in U.S. Pat. No. 6,362,449, hereby incorporated by reference, so that the microwave radiation 14 propagates substantially parallel to the axis 40 through the plasma chamber 18, which penetrates the shell 38. The waveguide 12 is designed so that the microwave radiation 14 exhibits peak intensity near a plasma generating point 42, disposed in close proximity to the axis 40, for substantially all the time that the microwave source 16 is energized.

The plasma chamber 18 has an inlet 50, an outlet 52, an axis 54, an inner volume 56, and an inner surface 58. The plasma chamber 18 penetrates the waveguide 12 so that the axis 54 is near the plasma generating point 42 and is substantially perpendicular to the axis 40. The inlet 50 is arranged to admit the process material 22, the process gas 26, and the shrouding gas 30 to the inner volume 56. The outlet 52 can be arranged so that at least one of a flow of the process gas 26 and a flow of the shrouding gas 30 continues for a substantial distance past the outlet 52.

Figure 3:
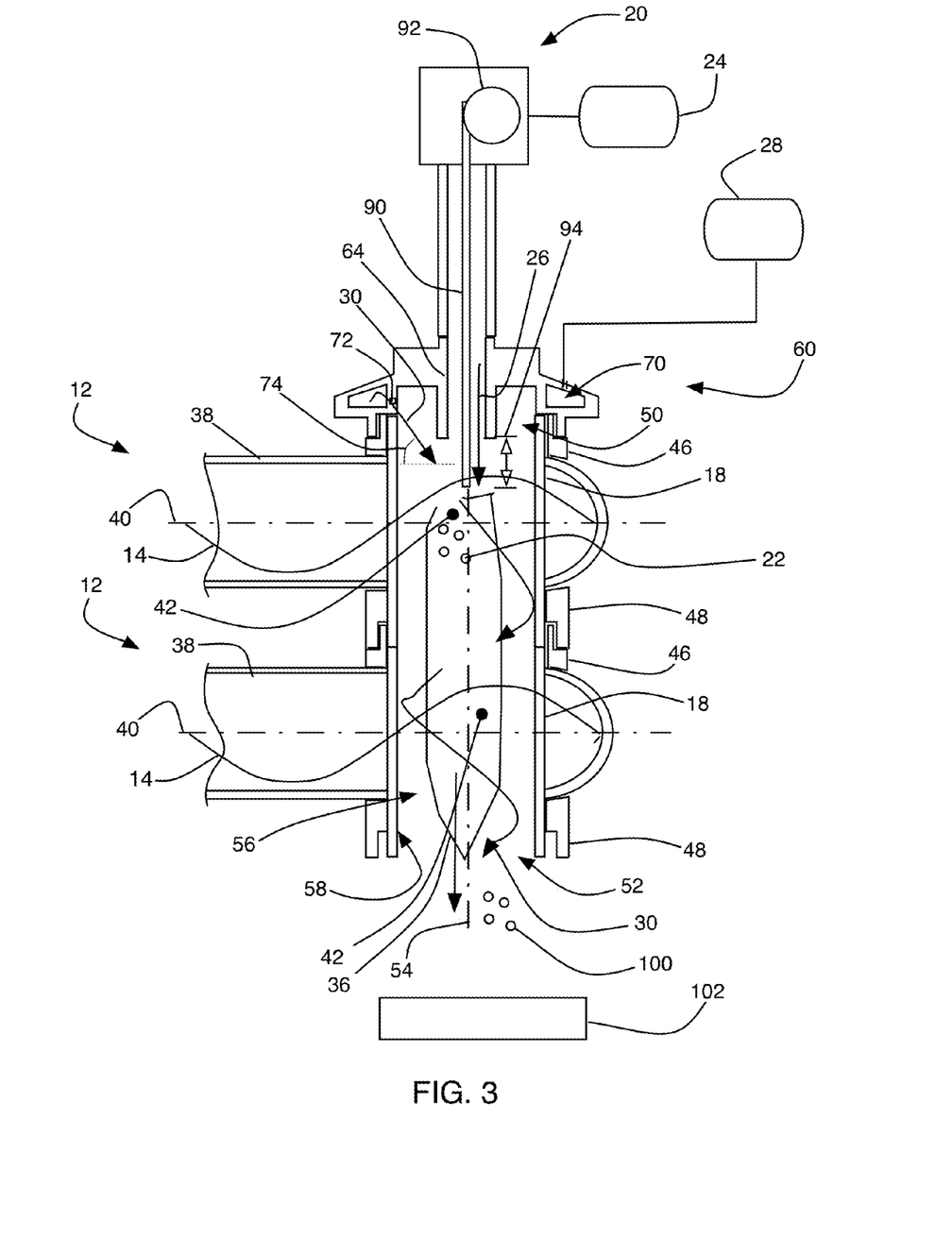
FIG. 3 is a schematic of two plasma chambers, stacked together and in communication with an emitter rod material feeding system of the apparatus of FIG. 1, according to another embodiment.

An inlet sleeve 46 houses an end of the plasma chamber 18 associated with the inlet 50, and an outlet sleeve 48 houses the other end of the plasma chamber 18 associated with the outlet 52. The inlet sleeve 46 and the outlet sleeve 48 position and support the plasma chamber 18 within the waveguide 12, and are in electrical contact with the waveguide 12. Preferably, the inlet sleeve 46 and the outlet sleeve 48 do not penetrate the waveguide 12. In an embodiment of the present invention, as shown in FIG. 3, the inlet sleeve 46 and the outlet sleeve 48 are adapted for mutual modular stacking assembly, and are in electrical contact each with the other when so assembled.

Referring back to FIG. 2, an inlet assembly 60 is assembled to the inlet sleeve 46. The inlet assembly 60 includes an emitter tube 64, a swirl chamber 70, and a plurality of swirl jets 72. The inlet assembly 60 is in electrical contact with at least one of the inlet sleeve 46 and the waveguide 12. The inlet assembly 60 may also include an injector 62.

If provided, the injector 62 is in fluid communication with the pressurized source 24 of the process gas 26. The injector 62 is appropriately aligned and dimensioned to provide a substantially laminar flow of the process gas 26, substantially parallel to the axis 54, throughout the plasma chamber 18. As shown in FIG. 3, the injector 62 can be omitted when the process gas 26 is supplied to the interior volume 56 via the emitter tube 64.

The emitter tube 64 protrudes from the inlet assembly 60 into the plasma chamber 18. The emitter tube 64 is arranged to introduce the process material 22 from the material feeding system 20 to the inner volume 56, and is appropriately aligned and dimensioned so that the process material 12 will enter the inner volume 56 with velocity substantially parallel to the axis 54. The emitter tube 64 also is dimensioned so as to permit insertion of a consumable electrode 68, shown in FIG. 4, from the material feeding system 20 to the inner volume 56.

The annular swirl chamber 70 is in fluid communication with the pressurized source 28 of the shrouding gas 30, and also is in fluid communication with the inner volume 56 via the plurality of swirl jets 72. The swirl jets 72 are arranged substantially perpendicular to, and substantially offset from, the axis 54, as discussed in U.S. Pat. No. 5,909,277, hereby incorporated by reference. The swirl jets 72 may lie in a plane perpendicular to the axis 54; however, the swirl jets 72 also may be arranged at an angle 74 with reference to a plane perpendicular to the axis 54. The angle 74 optimally is less than about four degrees (4°) and preferably is less than about forty-five degrees) (45°).

According to the embodiment shown in FIG. 2, the material feeding system 20 includes a piezoelectric multi-orifice droplet maker (PEMOD) 76 and a pressurized source 78 that supplies a carrier gas 80 to the PEMOD 76. The PEMOD 76 includes an orifice plate 82 that is in fluid communication with a reservoir 84 of a liquid 85 containing the process material 22. The orifice plate 82 has multiple orifices 86, through which the liquid 85 flows from the reservoir 84 to a mixing chamber 87. A piezoelectric actuator 88 is connected to the orifice plate 82 and is operable to vibrate the orifice plate transverse to the flow of the liquid 85 through the orifices 86, thereby producing droplets 89 of the liquid 85, according to the principle of Rayleigh instability in stream flow. As shown in FIG. 2, the pressurized source 78 supplies the carrier gas 80 to the mixing volume 87 in such a manner as to entrain the droplets 89 within the carrier gas 80. The carrier gas 80 then flows from the material feeding system 20 through the emitter tube 64 to the inner volume 56 of the plasma chamber 18. In the embodiment of FIG. 2, the orifices 86 are on the order of ten microns (10 μm) in diameter, however, the orifices 86 may be dimensioned according to a desired size of the droplets 89, based on an intended interaction of the droplets 89 with the plasma jet 36.

In another embodiment, as shown in FIG. 3, an emitter rod 90 protrudes from the material feeding system 20 through the emitter tube 64. The material feeding system 20 includes a friction wheel 92 that feeds the emitter rod 90 into the plasma chamber 18. A computer-controllable DC stepper motor (not shown) drives the friction wheel 92. A computer program to control the DC stepper motor adjusts the motor angle based on sensed or derived variables such as a plasma jet temperature, a microwave source power level, a process gas mass rate, and the emitter rod length 94. According to the embodiment shown in FIG. 3, the pressurized source 24 is in fluid communication with the material feeding system 20, and the process gas 26 enters the plasma chamber 18 via the emitter tube 64.

The plasma chamber 18 is designed to contain the plasma jet 36 and to avoid interfering with coupling of the microwave radiation 14 to the process gas 26. Accordingly, the plasma chamber 18 is constructed of a refractory and dielectric material that is substantially transparent to electromagnetic energy at the microwave radiation wavelength. Suitable materials for the plasma chamber 18 include quartz, boron nitride or any other material that can sustain very high temperatures and has very limited losses in the microwave spectrum. The plasma chamber 18 is appropriately dimensioned to accommodate a desired flow of the process material 22 and of the process gas 26, without significantly compromising the confinement of the microwave radiation 14 by the waveguide shell 38; for example, the plasma chamber 18 may be about one inch in diameter.

The inlet sleeve 46 and the outlet sleeve 48 are fabricated from a conductive material to prevent undesired leakage of the microwave radiation 14 from the waveguide 12. Additionally, using conductive material for the inlet sleeve 46 and the outlet sleeve 48 assists in cutting off or guiding propagation of the microwave radiation 14 along the plasma jet 36. For cutting off propagation of the microwave radiation 14 prior to establishment of the plasma jet 36, the outlet sleeve 48 should have a diameter no more than one half (½) of the wavelength of the microwave radiation 14, and preferably no more than one quarter (¼) of the wavelength of the microwave radiation 14. For cutting off propagation of the microwave radiation 14, the outlet sleeve 48 additionally should extend from the waveguide 22 at least as far as the extent of the plasma jet 36 beyond the outlet 52. For guiding propagation of the microwave radiation 14 along the plasma jet 36, for example when multiple microwave plasma apparatuses 10 are stacked in a modular assembly, as shown in FIG. 3, the outlet sleeve 48 should preferably have a diameter greater than one quarter (¼) of the wavelength of the microwave radiation 14.

The inlet assembly 60 is exposed to radiative heat transfer from the plasma jet 36, and covers an opening in the waveguide 12 made by the plasma chamber 18. Accordingly, the inlet assembly 60 is manufactured from a conductive material tolerant of high temperatures, for example a refractory metal such as tungsten or a refractory metal alloy such as high-chrome stainless steel. Manufacturing the inlet assembly 60 from a conductive material, and assembling the inlet assembly in close electrical contact with the waveguide 12, minimizes undesirable leakage of microwave radiation 14 from the waveguide. Welding the inlet assembly 60 to the inlet sleeve 46, then welding the inlet sleeve 46 to the waveguide 12, is one convenient method for providing close electrical contact.

Within the waveguide 12, the emitter tube 64 is fabricated from a refractory dielectric material that can sustain high temperature and high thermal shock. Making the emitter tube 64 from a dielectric material minimizes leakage of microwave radiation from the waveguide 12 via the emitter tube 64, and minimizes undesirable interference by the emitter tube 64 with the microwave radiation 14. Making the emitter tube 64 from a refractory material enhances the durability of the emitter tube 64 in the vicinity of the plasma jet 36. A portion of the emitter tube 64 external to the waveguide 12 may be made of a conductive material, for example, the portion of the emitter tube that is assembled to the inlet assembly 60.

Figure 4:
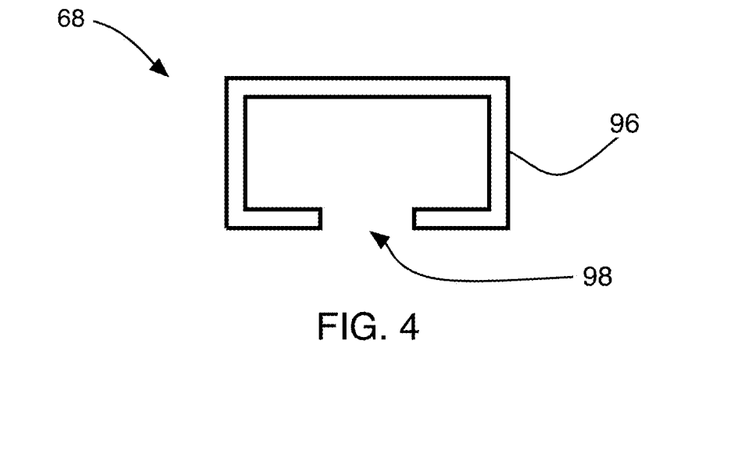
FIG. 4 is a front view of a consumable electrode for igniting a plasma jet in the apparatus of FIGS. 1-3.

The consumable electrode 68, as shown in FIG. 4, includes a conductive material 96 arranged to provide a spark gap 98. The microwave radiation 14 couples to the conductive material 96 to produce an electrical charge, which then discharges across the spark gap 98, as further discussed below.

The liquid 85 may be a solution or a suspension that includes, but is not limited to, the process material 22 and a solvent compatible with the process material 22, with the carrier gas 80, and with the process gas 26 for the purpose of an intended thermal spray application.

The emitter rod 90 is formed from a composition that includes, but is not limited to, the process material 22 and filler materials suitable for the intended application of the plasma apparatus 10. Because the emitter rod 90 protrudes into the inner volume 56 of the plasma chamber 18, it is desirable that, if the emitter rod 90 contains a substantially conductive material, the emitter rod 90 should be in electrical contact with the inlet assembly 60, so as to minimize leakage of the microwave radiation 14 from the waveguide 12.

To begin operation of the apparatus 10, the process gas 26 is supplied to the plasma chamber 18 from the pressurized source 24 via the injector 62, and the microwave radiation 14 is supplied to the plasma chamber 18 from the microwave source 16 via the waveguide 12. Before the process gas 26 is ionized, the microwave radiation 14 does not couple to the process gas 26. Thus, to ignite the plasma jet 36, the process gas 26 is ionized to enable coupling of microwave radiation 14 to the process gas. After the process gas 26 has been ionized, the microwave radiation 14 will couple to the ionized process gas near the plasma generating point 42 within the plasma chamber 18 to ignite the plasma jet 36. Thereafter, the high temperature of the plasma jet 36 ionizes the process gas 26 within the plasma chamber 18, thereby sustaining the plasma jet.

Preferably, the process gas 26 is ionized by interaction of the microwave radiation 14 with the consumable electrode 68, shown in FIG. 4. To ionize the process gas 26 using the consumable electrode 68, the consumable electrode is introduced through the emitter tube 64 to the plasma chamber 18, within the flow of the process gas 26, while the microwave source 16 is energized. The microwave radiation 14 couples to the conductive material 96 of the consumable electrode 68, producing an electric spark across the spark gap 98 and thereby igniting the plasma jet 36. The electric spark produced by the microwave radiation 14 substantially destroys the consumable electrode 68, and the process gas 26 carries the remainder of the consumable electrode 68 beyond the outlet 52. Thus, once the plasma jet 36 is ignited, the consumable electrode does not interfere with coupling of the microwave radiation 14 to the process gas 26. Accordingly, the consumable electrode is preferred for ionizing the process gas 26 to ignite the plasma jet 36.

Because the plasma jet 36 can reach extremely high temperatures, on the order of six thousand Kelvin (6000 K), the shrouding gas 30 should be supplied to the inner surface 58 prior to ignition of the plasma jet 36. The shrouding gas 30 is supplied from the pressurized source 28 through the swirl jets 72, so as to establish a substantially laminar flow of the shrouding gas 30 in a swirling or helical manner between the process gas 26 and the inner surface 58. After ignition of the plasma jet 36, the swirling flow of the shrouding gas 30 prevents the plasma jet 36 from adhering to the inner surface 58, and thereby prevents melting of the plasma chamber 18 by conductive heat transfer between the plasma jet 36 and the inner surface 58. The shrouding gas 30 also removes a portion of the heat transferred by radiation from the plasma jet 36 to the inner surface 58. The shrouding gas 30 also aids in maintaining laminar flow of the process gas 26. Additionally, in the embodiments shown in FIGS. 2 and 3, the swirling flow of the shrouding gas 30 continues for a substantial distance beyond the outlet 52 of the plasma chamber 18, preventing entrainment of ambient gases in the plasma jet 36, thereby enabling the microwave plasma apparatus 10 to produce droplets of the product material 100 that exhibit exceptionally uniform properties under atmospheric or super-atmospheric pressure as well as under substantial vacuum.

When the plasma jet 36 is established, the material feeding system 20 is energized to supply the process material 22 to the plasma chamber 18. After entering the plasma chamber 18, the process material 22 becomes entrained in the plasma jet 36.

In the embodiment shown in FIG. 2, the material feeding system 20 supplies the process material 22 as a spray of droplets 89 suspended in a carrier gas 80. The droplets 89 are formed from a liquid 85 containing the process material 22.

The liquid 85 is supplied from the reservoir 84 to the mixing chamber 87 via the orifices 86 of the PEMOD 76. The piezoelectric actuator 88 vibrates the orifice plate 82 transverse to the flow of the liquid 85 through the orifices 86, at a frequency such that the flow of the solution or the suspension through the orifices is broken into a stream of discrete droplets, according to the principle of Rayleigh instability in low-velocity liquid streams. Preferably, the PEMOD 76 produces highly uniform droplets, i.e. droplets that are uniform in size within plus or minus a few percent, each of the droplets containing a substantially uniform quantity of the process material 22. The droplets 89 become suspended in the carrier gas 80 as the carrier gas flows through the mixing chamber 87. The carrier gas 80 is provided to the plasma chamber 18 through the emitter tube 64 so as to thoroughly mix with the process gas 26 provided through the injector 62, such that the process material 22 becomes entrained in the process gas 26 and in the plasma jet 36. For example, the droplets containing the process material 22 may be approximately ten microns (10 μm) in diameter and the carrier gas 80 may be injected to the plasma chamber 18 along a line substantially parallel to the axis 54. Substantially all of the injected droplets will be entrained in the process gas 26 and will substantially match the velocity of the process gas. For example, the velocity uniformity for fully developed pipe flow is within about twenty five percent (±25%) throughout a region surrounding the axis 54 within about one-half a radius of the plasma jet 36, presuming laminar axial flow of the process gas 26 throughout the plasma chamber 18.

The substantial uniformity of the droplets 89 enables the microwave plasma apparatus 10 to provide the product material 100 with substantially greater uniformity of size, velocity, temperature, and melting state than previously has been achievable. In the embodiment shown in FIG. 2, the product material 100 exits the plasma chamber 18 either as molten droplets or partly molten particles having substantial velocity toward a target 102. All of the product material 100 is substantially uniform in particle or droplet size, velocity, temperature, and phase.

The target 102 is a substrate, or a powder collection means such as a cold finger, a cyclone separator, a coolant bath, or an electrostatic precipitator. By impact upon the substrate or powder collection means 102, the molten droplets or partly molten particles of the product material 100 form a surface coating or a powder.

Figure 5:
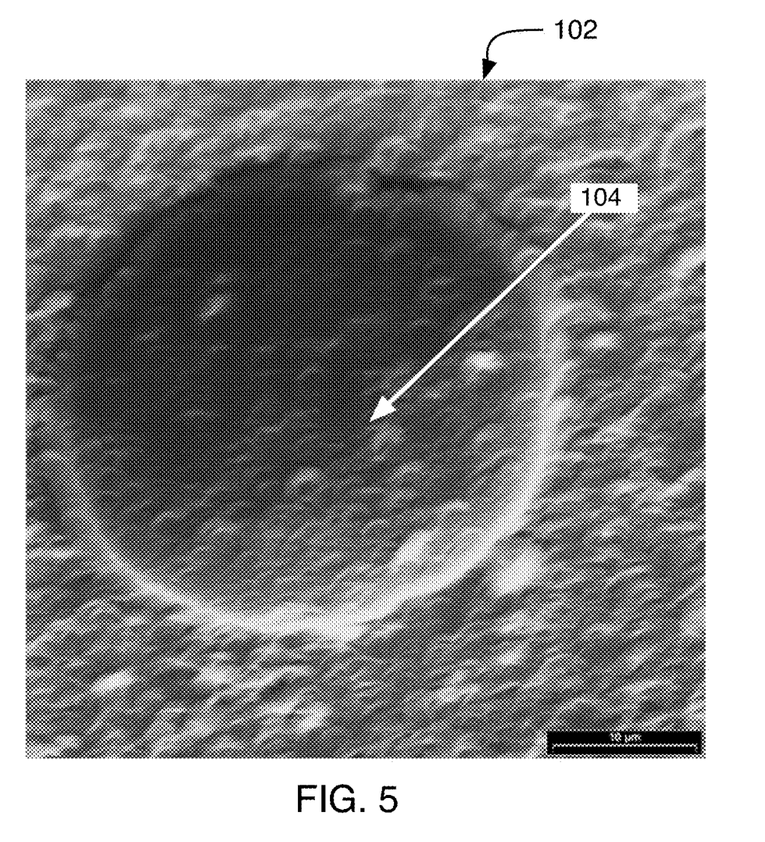
FIG. 5 is a photo-micrograph of a thirty micron (30 μm) diameter yttria stabilized zirconia splat on a stainless steel target, as produced by an exemplary embodiment of the present invention.

For example, as shown in FIG. 5, an experimental embodiment of the present invention deposited a thirty micron (30 μm) diameter yttria stabilized zirconia splat 104 on a stainless steel substrate 102. The splat 104 shown in FIG. 5 demonstrates the ability of the plasma chamber 18 to produce thoroughly molten droplets. By combining the plasma chamber 18 and the PEMOD 76, the microwave plasma apparatus 10 repeatably produces either molten droplets with substantially zero unmelted material, or partly molten particles exhibiting uniformity in the amount of unmelted material significantly superior to the uniformity achievable by prior known means.

The embodiment of FIG. 2 may also be used for producing powder of an amorphous glass, for example by providing a coolant bath as the target 102. The amorphous glass powder produced by the microwave plasma apparatus 10 in combination with a coolant bath target 102 is substantially superior in uniformity of properties to amorphous glass powders produced by prior devices.

In the embodiment shown in FIG. 3, the plasma jet 36 comes into contact with and ionizes at least a portion of the emitter rod 90, while the process gas 26 is provided through the injector 62 so as to flow along a surface of the emitter rod. The process gas 26 alternatively may be provided through the material feeding system 20, as shown in FIG. 2. The plasma jet 36 releases the process material 22 from the emitter rod 90 by melting, vaporization, or ablation. Thermal emission of electrons from the emitter rod 90, in addition to the swirling flow of the shrouding gas 30, stabilizes the plasma jet 36 axially and longitudinally within the plasma chamber 18. The process gas 26 erodes released particles of the process material 22 from at least a part of the portion of the emitter rod 90, thereby entraining the process material in the plasma jet 36. The friction wheel 92 advances the emitter rod 90 into the plasma chamber 18 at a rate that substantially balances the erosion of the emitter rod by the process gas 26, thereby maintaining the emitter rod 90 in contact with the plasma jet 36. Known prior designs have taught an emitter rod as a non-preferred means for stabilizing a plasma jet, due to erosion and breakage of prior art emitter rods. The present design differs from the prior designs at least in that the erosion of the emitter rod 90 is made a functional feature of the present invention.

According to the embodiment shown in FIG. 3, heat transferred from the plasma jet 36 to the process material 22 thermally transforms the process material to the product material 100, and the flow of the plasma jet 36 carries the product material 100 beyond the outlet 52 of the plasma chamber 18. The product material 100 exits the plasma chamber 18 as a vapor. The target 102 can be a cold plate, a cold finger, or any other means for collecting the vapor product material 100 as a highly uniform powder. In a variation on the embodiment shown in FIG. 3, several microwave plasma apparatuses 10 may be arranged in cascade, with the powdered product material 100 of a first microwave plasma apparatus becoming the process material 22 of a second microwave plasma apparatus.

At microwave source power levels at or above about one kilowatt (1 kW), the microwave radiation 14 can propagate through the plasma jet 36 substantially parallel to the axis 54 to produce an exceptional length of the plasma jet 36 beyond maximum lengths known to be possible with RF or DC arc plasmas. Among other variables, increasing the power level of the microwave source 16 and the velocity of the process gas 26 can enhance the length of the plasma jet 36. However, excessive velocity or mass flow of the process gas 26 can exceed the ability of the microwave radiation 14 to couple with the process gas, thereby extinguishing the plasma jet 36. The length of the plasma jet 36 also can be enhanced by stacking multiple microwave plasma apparatuses 10 in a modular fashion, as made possible by the design of the inlet sleeve 46 and the outlet sleeve 48. The conductive material of the inlet sleeve 46 and the outlet sleeve 48 helps to propagate the microwave radiation 14 within the plasma jet 36 substantially parallel to the axis 54. In an exemplary embodiment, the plasma jet 36 extended up to five inches (5").

Because the process gas 26, the process material 22, and the carrier gas 80 all may be closely mixed in the plasma jet 36, it is desirable that the process gas 26, the process material 22, and the carrier gas 80 be of compositions mutually suitable for accomplishing the intended purpose of the apparatus. Suitable compositions for the process gas 26 and the carrier gas 80 are known to those having skill in the art, and include, but are not limited to, typically non-reactive gases such as helium or argon as well as potentially reactive gases such as air or nitrogen, as required for the intended thermal transformation.

Desirable compositions for the process material 22 include, but are not limited to, any of oxide, nitride, and carbide ceramics, rare earth ceramics, metals, and metal alloys.

Desirable frequencies for the microwave source 16 include, but are not limited to, frequencies between about five hundred megahertz (500 MHz) and about one hundred gigahertz (100 GHz). For example, a microwave source has been used having a frequency of nine hundred fifteen megahertz (915 MHz) and at seventy five kilowatts (75 kW) output power. Another microwave source has been used having a frequency of two and one-half gigahertz (2.5 GHz).

One advantage of the present invention is that, by preventing entrainment of ambient gases in the plasma jet external to the plasma chamber, the interaction of the shrouding gas with the plasma jet enables operation of the microwave plasma apparatus in atmospheric and super-atmospheric pressures.

Another advantage of the invention is that the design allows axial injection of materials into an organized laminar flow of gas. As a result each injected particles has very similar thermal history to the others. For example for fully developed flow particles injected within one half the tube radius have velocities that are the same within 25%. This leads to similar residence times and similar melting behavior.

Another advantage of the invention is that the axial injection configuration allows the use of a piezoelectric droplet maker that can produce highly uniform droplet sizes. This when combined with the near uniform residence time leads to a highly uniform melt state producing highly homogeneous coatings and powders compared to related technologies.

A further advantage of the present invention is that by carefully selecting the shrouding gas, powders may be made or coatings may be deposited using process materials that normally react with air, most particularly oxygen. For example, using nitrogen as the shrouding gas, boron nitride (which does not melt in air) may be processed to a highly uniform powder.

Another advantage of the present invention is that microwave excitation of the plasma jet enables the microwave plasma apparatus to provide plasma jet temperatures as high as about six thousand Kelvin (6000 K), nearly twice the highest known attainable stoichiometric combustion temperature (three thousand Kelvin (3000 K) for a hydrogen-oxygen flame). Thus, the present invention can achieve thorough heating of a coating material at higher velocity and larger particle sizes, in a smaller distance, than can be attained using an oxy-fuel torch.

A further advantage of the present invention is that microwave excitation of the plasma jet does not introduce impurities to the plasma jet, either from combustion products or from electrode erosion. Thus, the present invention enables deposition of a substantially chemically purer surface coating than can be deposited using prior art devices.

Yet another advantage of the present invention is that microwave excitation of the plasma jet efficiently converts up to about ninety percent (90%) of supplied electrical energy to enthalpy of the plasma jet. This efficiency exceeds that of previously known devices by a factor of between about two times and about three times, with the exception of relatively efficient radio-frequency (RF) plasma devices.

Another advantage of the present invention is that microwave excitation of the plasma jet is not significantly disrupted by protrusion of substantially microwave-transparent dielectric components into the plasma chamber. Thus, the apparatus can be designed for optimal injection of the material to the plasma jet without regard to the structural limitations imposed by a DC electric arc plasma torch. In particular, the present invention enables optimal axial injection of small particles by means not achievable in the prior art.

A further advantage of the present invention is that, because substantially all of the microwave radiation is confined within the waveguide and the sleeves, and then is absorbed by the plasma jet or captured by the reflected power protector, radiation leakage is maintained within safe levels.

An additional advantage of the present invention is that multiple microwave plasma apparatuses can be stacked in a modular fashion because the waveguide, the impedance matching unit, and the reflected power protector cooperate to prevent interference between adjacent plasma jets. Stacking multiple microwave plasma apparatuses can permit extremely uniform heating of the process material to temperatures between about three thousand Kelvin (3000 K) and about six thousand Kelvin (6000 K).

A further advantage of the present invention is that the microwave plasma apparatus, due to its ability to achieve very nearly complete (100%) melting of the product material droplets, will be markedly superior to prior devices used to produce the necessary highly uniform amorphous powders needed for making amorphous glasses in a coolant bath.

In an alternate embodiment, the process gas 26, the shrouding gas 30, and the carrier gas 80 may be a single gas and may be provided from a single pressurized source through one or several structures imparting to various portions of the single gas motions appropriate to the respective purposes of the various portions. For example, as discussed above, the carrier gas 80 may serve the functions of the process gas 26. As a further alternative, the process gas 26 may act both as the shrouding gas 30 and as the carrier gas 80 by appropriately modifying the structure of the emitter tube 64.

In another alternate embodiment, the material feeding system 20 forms the droplet spray of the process material 22 from a liquid or solution of the process material 22, using any of a hydraulic atomizer, a transverse gas blast atomizer, a vibratory instability atomizer, a drop on demand atomizer, an ultrasonic nebulizer, and an electromagnetic nebulizer. In another embodiment, the droplet spray of the process material 22 is formed from a slurry, a suspension, or an emulsion of the process material 22, using any of a vibratory instability slurry droplet maker, a rotating disk atomizer, and a gas atomizer. In another embodiment, the material feeding system 20 provides a powder aerosol of process material 22. The powder aerosol is formed by any of a prilling device, a monodisperse droplet maker, and a microwave plasma apparatus 10 in combination with vapor-powder collecting means as taught by the present invention. In another embodiment, the material feeding system 20 feeds solid particles of process material 22 using a fluidized-bed powder feeder. In other embodiments, the material feeding system 20 evaporates the process material 22 for mixing with the carrier gas 80, or provides the evaporated process material 22 as the carrier gas 80.

In another embodiment, the droplets of process material 22 is a "dry fog" consisting essentially of liquid droplets of less than about ten microns (10 μm) diameter. In the dry fog, surface tension forces will overcome cohesive and adhesive forces so that the droplets will neither aggregate nor stick to surfaces. By preheating the dry fog prior to its injection to the plasma chamber 18, optimal interaction will be obtained between the dry fog and the plasma jet 36. Supplying the process material 22 as a dry fog is particularly conducive to chemical reaction of the material within the plasma jet 36.

In a further embodiment, the process material 22 is supplied to the plasma chamber 18 as a preheated dry fog. The product material 100 exits the outlet 52 as plasma, and interacts with the substrate target 102 to form a vapor-deposited film exhibiting substantially more uniform properties than achieved by plasma-sprayed coatings of prior art devices.

In yet another embodiment, the process material 22 may be supplied in a dry fog preheated sufficiently to remove substantially all of the solvent, thus creating a dust feed of dry particles significantly smaller than could be fed from a fluidized bed. Due to surface forces, traditional powder feed methods cannot be used at sizes smaller than about ten microns (10 μm).

In another embodiment, the emitter tube 64 is arranged at a substantial angle relative to the axis 54.

In another embodiment, multiple material feedings systems 30 provide various process materials 24 simultaneously or sequentially to the plasma chamber 18.

In yet another alternate embodiment, the emitter rod 90 may be advanced into the chamber not by a motor-driven wheel 92, but by a pneumatic actuator, by an adjustable friction gravity feed, by hand, or by any other means to advance the rod into the plasma chamber.

In another embodiment, the angle 74 is about ninety degrees (90°) with reference to a plane perpendicular to the axis 54, and the shrouding gas 30 flows substantially parallel to the axis 54 along the inner surface 58, with substantially greater velocity than the flow of the process gas 26.

Although this invention has been shown and described with respect to the detailed embodiments thereof, it will be understood by those skilled in the art that various changes in form and detail thereof may be made without departing from the spirit and the scope of the invention. For example, the inlet assembly could be made of brass or nickel. The outlet sleeve could be tapered to provide a nozzle effect, or flared to provide a diffuser effect. The waveguide could be circular or rectangular in cross section, and could be either a fundamental mode waveguide or an over-moded optical waveguide.

What is claimed is:

1. A microwave plasma apparatus for processing a material, comprising:
   a plasma chamber;
   a microwave radiation source for generating microwave radiation;
   a waveguide guiding the microwave radiation from the microwave radiation source to the plasma chamber, the waveguide including a shell defining a longitudinal axis;
   a gas supply in fluid communication with the plasma chamber for providing a gas to the plasma chamber; and
   a material feeding system in communication with the plasma chamber for introducing a process material to the plasma chamber, the material feeding system comprising:
   an emitter wire formed at least in part from the process material and protruding into the plasma chamber;
   a gas injector that imparts to the gas a velocity into the chamber and substantially along a surface of the emitter wire; and
   means for advancing the emitter wire into the plasma chamber;

wherein the microwave radiation couples to the gas to form a plasma;

wherein the gas injector and emitter wire are positioned relative to each other such that the gas and the emitter wire are in direct fluid contact upstream of the plasma;

wherein the emitter wire is advanced into the chamber in a direction perpendicular to the longitudinal axis defined by the shell such that the plasma comes into contact with the advancing emitter wire and erodes a portion of the advancing emitter wire; and wherein the process material, through contact with the plasma, forms a product material.

2. The apparatus according to claim 1, further comprising a gas injector that causes the gas to flow laminarly and substantially parallel to an axis of the plasma chamber.

3. The apparatus according to claim 2, wherein a portion of the process gas is used as a shrouding gas.

4. The apparatus according to claim 2, further comprising a second supply in fluid communication with the plasma chamber for providing a shrouding gas to the plasma chamber.

5. The apparatus according to claim 4, further comprising a swirl structure that causes the shrouding gas to flow in a substantially laminar flow or in a substantially helical swirl between the plasma and an inner surface of the plasma chamber.

6. The apparatus according to claim 1, wherein the process material comprises oxide ceramics, nitride ceramics, carbide ceramics, rare earth ceramics, metals, or metal alloys.

7. The apparatus according to claim 1, wherein the plasma chamber includes an outlet, and the plasma extends past the outlet.

8. The apparatus according to claim 1, wherein the plasma chamber includes a gas injector that causes the gas to flow laminarly or substantially parallel to an axis of the plasma chamber.

9. The apparatus according to claim 1, wherein the plasma chamber includes an outlet, and wherein a target is arranged proximate the outlet so that the product material impacts on the target.

10. The apparatus according to claim 9, wherein the target is a substrate to be coated.

11. A method for processing a material in a plasma chamber, comprising the steps of:
providing microwave radiation and a gas in a plasma chamber such that the microwave radiation couples to the gas to generate a plasma having a substantially laminar flow along an axis; and
introducing a process material into the substantially laminar flow of the plasma in a direction substantially parallel to the axis of the substantially laminar flow;
wherein the process material, through contact with the plasma, forms a product material; and
wherein the step of introducing the process material includes advancing into the plasma chamber an emitter wire formed at least in part from the process material and in direct fluid contact with the gas such that the plasma comes into contact with the advancing emitter wire and erodes a portion of the advancing emitter wire.

12. The method according to claim 11, wherein the gas provided in the plasma chamber is ionized.

13. The method according to claim 11, wherein the gas flows are laminar and substantially parallel to an axis of the plasma chamber.

14. The method according to claim 13, wherein a portion of the process gas is used as a shrouding gas.

15. The method according to claim 13, further comprises the step of providing a shrouding gas in the plasma chamber.

16. The method according to claim 15, wherein the shrouding gas flows in a substantially laminar flow or a substantially helical swirl between the plasma jet and an inner surface of the plasma chamber.

17. The method according to claim 11, further comprising a step of discharging the product material from the plasma chamber.

* * * * *